United States Patent [19]

Pampalone et al.

[11] Patent Number: 4,810,619

[45] Date of Patent: Mar. 7, 1989

[54] PHOTOLITHOGRAPHY OVER REFLECTIVE SUBSTRATES COMPRISING A TITANIUM NITRIDE LAYER

[75] Inventors: Thomas R. Pampalone, Flemington; Brian C. Lee, Somerville; Edward C. Douglas, Flemington, all of N.J.

[73] Assignee: General Electric Co., Somerville, N.J.

[21] Appl. No.: 84,464

[22] Filed: Aug. 12, 1987

[51] Int. Cl.$^4$ .............................................. G03C 5/18
[52] U.S. Cl. .................... 430/313; 430/316; 430/317; 430/318; 430/323
[58] Field of Search ............... 430/323, 316, 317, 318, 430/313

[56] References Cited

U.S. PATENT DOCUMENTS

| | | | |
|---|---|---|---|
| 2,791,504 | 12/1952 | Plambeck | 430/276 |
| 3,201,239 | 8/1965 | Neugebauer et al. | 96/36 |
| 4,226,932 | 10/1980 | Ferraris | 430/312 |
| 4,288,283 | 9/1981 | Umezaki et al. | 430/318 |
| 4,311,773 | 1/1982 | Kaneko et al. | 430/292 |
| 4,321,104 | 3/1982 | Hasegawa et al. | 430/318 |
| 4,362,809 | 12/1982 | Chen et al. | 430/312 |
| 4,370,405 | 1/1983 | O'Toole et al. | 430/312 |
| 4,509,161 | 4/1985 | Van DeLeest et al. | 430/321 |
| 4,535,053 | 8/1985 | West et al. | 430/312 |
| 4,617,252 | 10/1986 | Cordes, III et al. | 430/318 |
| 4,714,668 | 12/1987 | Uneno et al. | 430/317 |

OTHER PUBLICATIONS

Thin Solid Films, 78(1981), 161–165, Electronics and Optics. Optical Properties of Substiochiometric TiN$_x$, Authors: J. Rivory, J. M. Behaghel, S. Berthier and J. Lafait.

Solar Energy Materials, 7(1982), 299–312, North-Holland Publishing Company, The Optical Properties of Titanium Nitrides and Carbides: Spectral Selectivity and Photothermal Conversion of Solar Energy, Authors: L. Roux, J. Hanus, J. C. Francois, and M. Sigrist.

Primary Examiner—Paul R. Michl
Assistant Examiner—Patrick A. Doody
Attorney, Agent, or Firm—K. R. Glick; Birgit E. Morris

[57] ABSTRACT

For fine line lithography of a reflective substrate, a layer of titanium nitride is applied between the reflective surface and the photoresist that is absorbant at the wavelength of light used to expose the photoresist. The resolution of the photoresist is improved, even when an absorbant dye is used in the photoresist. The titanium nitride can be readily removed at the same time as the reflective layer is patterned, thereby avoiding the need of a separate step to remove the absober layer during etching of the reflective substrate.

13 Claims, 4 Drawing Sheets

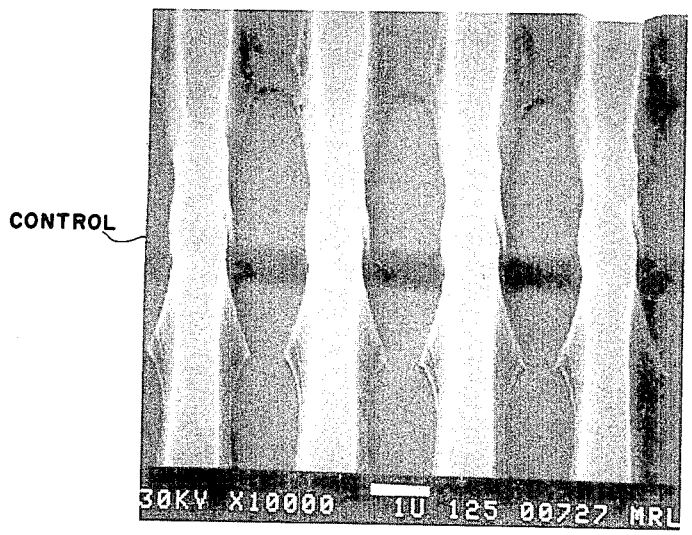
FIG. 4
FIG. 5
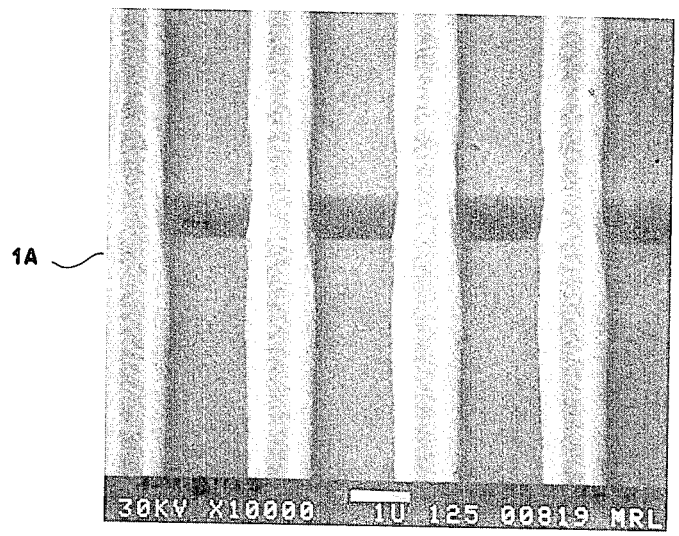

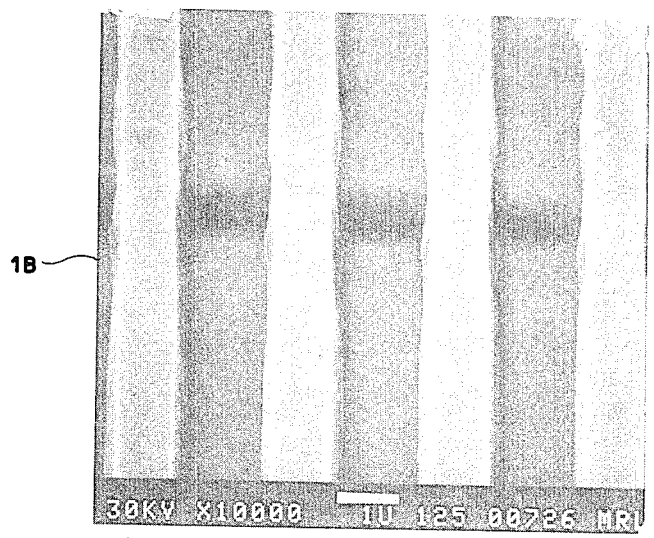
FIG. 6
FIG. 7
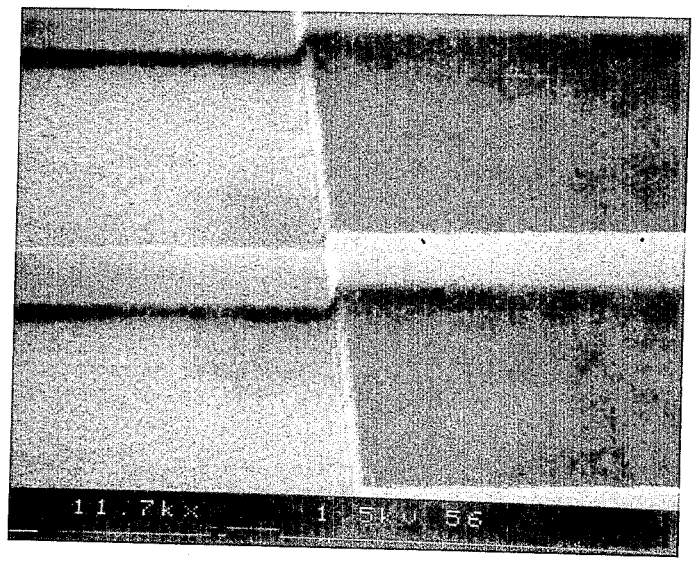

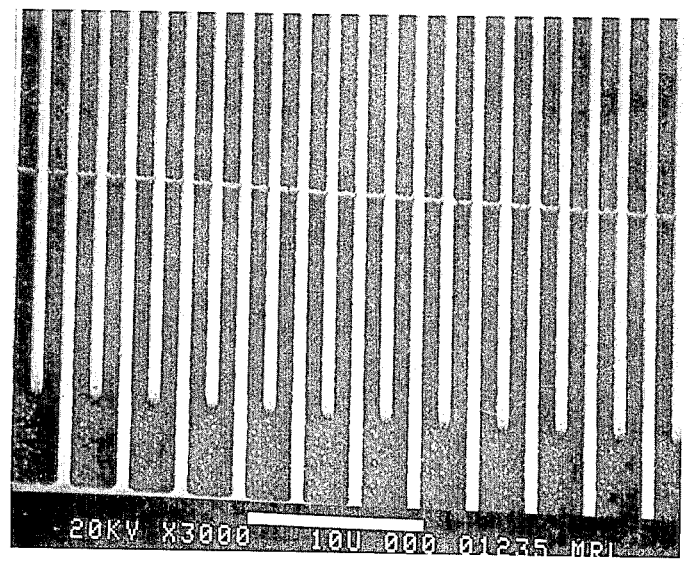
FIG. 8
FIG. 9
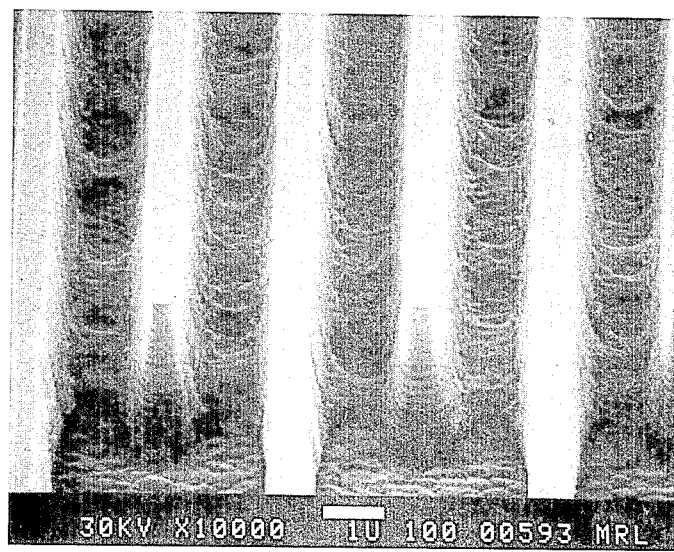

PHOTOLITHOGRAPHY OVER REFLECTIVE SUBSTRATES COMPRISING A TITANIUM NITRIDE LAYER

This invention relates to fine line lithography. More particularly, this invention relates to fine line lithography over reflective substrates.

When photoresist fine line patterns are made over reflective substrates, such as aluminum or tantalum silicide, standing wave patterns are generated in the photoresist by the exposure light reflected from the substrate back into the photoresist layer. These patterns cause a degradation in the resolution of the photoresist which become more significant as line widths become smaller and closer together. Further, when the metal layer is over a step in the substrate, these problems are exacerbated.

Photoresist containing a dye to absorb reflected light have been used to pattern fine lines, on the order of 1.25 micron lines of tantalum silicide over 0.5 micron steps, or 1.25 micron aluminum lines on a flat substrate. However dyed resists have limitations; for example dyed resists are not effective for smaller lines or for aluminum over steps. Line width variations of 0.1 to 0.14 micron for 1.0 micron lines of tantalum silicide are found for dyed resists, which are unacceptable. Dyed resists have not been able to be used for patterning aluminum lines at less than 4 microns over a 0.5 micron step.

If the reflectivity of the metal layers could be reduced to 30% or less, higher resolution patterning over steps would be possible whether dyed resists were used or not. Aluminum has a reflectivity generally of 80–90%. Thus absorptive coatings under the resist have been considered.

In order to be useful as an absorbant layer, the absorber must be thin, must be totally insoluble in the overlying photoresist, and must be able to be removed readily from the exposed areas after development of the resist.

Several organic materials have been suggested as absorber layers. Anti-reflective coatings of a partially cured polyamic acid containing a dye have been tried. This coating is totally immisible in the photoresist and can be removed with the photoresist during development. However this coating is difficult to employ in production because the curing of the polyamic acid must be very carefully controlled, to within 1° C. of baking temperature, to get a similar dissolution rate as the resist.

Inorganic layers which would avoid curing problems have also been suggested as absorber layers. Metallic layers such as tungsten, vanadium or polysilicon have comparatively high reflectivities however, of over 50%.

Metal oxide layers, such as oxides of chromium, silicon, molybdenum and the like, have low reflectivities, but are difficult to remove in the exposed areas and generally a separate plasma etching step is required to remove these absorber layers from that used to remove the underlying reflective layer. This adds to the cost of the process.

Thus a search for an inorganic absorber layer, incompatible with with an overlying resist layer but patternable with the underlying reflective layer, and having a reflectivity of less than about 50%, and preferably less than about 30%, has continued.

SUMMARY OF THE INVENTION

We have found that titanium nitride is a very effective absorber layer, immisible in an overlying photoresist layer and readily removed from exposed and developed photoresist areas at the same time and in the same way as is used to etch away underlying reflective layers. The resultant lines and spaces are much improved in line width control and uniformity and can be employed for patterns down to 0.75 micron, even over topographical features of 0.5 micron or more.

BRIEF DESCRIPTION OF THE DRAWINGS

FIGS. 4 to 9 are electron photomicrographs of developed substrates as hereinbelow described.

DETAILED DESCRIPTION OF THE INVENTION

Figure 1:
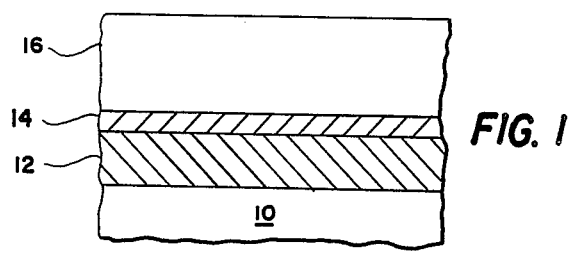
FIGS. 1 to 3 are cross-sectional views illustrating the process of the present invention.

Absorbing titanium nitride can be applied over a metallic or other reflective layer in several ways. The absorption varies slightly from one method to another but in general is about 30% or less.

Absorbing titanium nitride can be applied stoichiometrically by chemical vapor deposition (CVD); or by sputtering, in a plasma or by electron beam deposition. Non-stoichiometric layers can be made by reaction of titanium films with nitrogen by rapid thermal annealing or by baking in a furnace. For example, a non-stoichiometric absorbing titanium nitride layer can be made by depositing an 8000 Angstrom thick film of titanium and treating it by rapid thermal anneal at 800° C. or above for 60 seconds in nitrogen. The reflectivity of the film is consistently 25–30%. The percent reflectivity is somewhat higher, about 50%, when lower anneal temperatures are used. However low reflectivity titanium nitride films can be made at lower temperatures of about 400° C. by heating in a furnace in nitrogen for periods of about ½ hour or more.

Low reflectivity $TIO_xN_y$ wherein x is about 0.8–1.3 and y is about 0.8–1.2, can also be made by RF plasma reactive sputtering of titanium films in a mixed argon-nitrogen-oxygen gas mixture. The reflectivity varies somewhat depending on the thickness and oxygen content of the titanium nitride. Table I below is illustrative of the reflectivity of titanium oxynitride films deposited on silicon substrates:

TABLE I

| Ti | N | O | Thickness, Angstroms | % Reflectivity at 436 nm |
| --- | --- | --- | --- | --- |
| 1.00 | 1.17 | 0.95 | 300 | 15 |
| 1.00 | 1.06 | 0.95 | 750 | 12 |
| 1.00 | 1.02 | 0.89 | 1000 | 17 |
| 1.00 | 0.89 | 0.83 | 1200 | 7 |
| 1.00 | 0.85 | 0.84 | 1900 | 14 |
| 1.00 | 0.97 | 1.30 | 270 | 22 |
| 1.00 | 0.84 | 1.00 | 340 | 17 |
| 1.00 | 0.93 | 1.17 | 1580 | 8 |
| 1.00 | 1.13 | 0.96 | 250 | 33 |

These titanium oxynitride films are meant to be included in the general term titanium nitride as used herein.

The low reflectivity of titanium nitride films obtain over a wide portion of the spectrum, i.e. from about 300 nanometers to about 600 nanometers.

The process of the invention can be further described by reference to the Drawing.

An absorbing titanium nitride film 14 is deposited over a reflective metal layer 12, such as tantalum silicide or aluminum, on a substrate 10. The titanium nitride layer 14, in turn is coated with a photoresist layer 16. The photoresist 16 is conventional and can contain an absorptive dye, as is known. The resulting structure is shown in FIG. 1.

Figure 2:
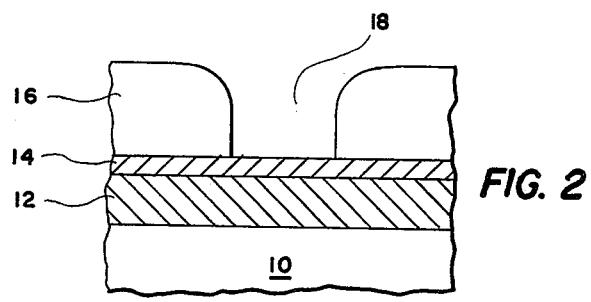

The photoresist 16 is then exposed in known manner through a mask (not shown) and developed by conventional wet development to form openings 18 in the photoresist layer 16, thereby exposing a portion of the titanium nitride layer 14, as shown in FIG. 2.

Conventional plasma etching can now be employed which will etch both the titanium nitride layer 14 and the reflective layer 12 at the same time. When the reflective layer is aluminum, a chlorine containing gas can be employed that will etch both layers sequentially. The etch rates for titanium nitride and titanium oxynitride are given below in Table II:

TABLE II

| Material Etched | Etchant | Etch Rate, Angstroms/Minute |
|---|---|---|
| (1) Aluminum (1% Silicon) | $Cl_2$ | 700–800 |
| (2) TiON | " | 130–225 |
| (3) AZ1350 Photoresist | " | 400 |
| (4) TaSi$_2$ | $CHCl_3$ | 1500 |
| (5) TiON | " | 1500 |

Figure 3:
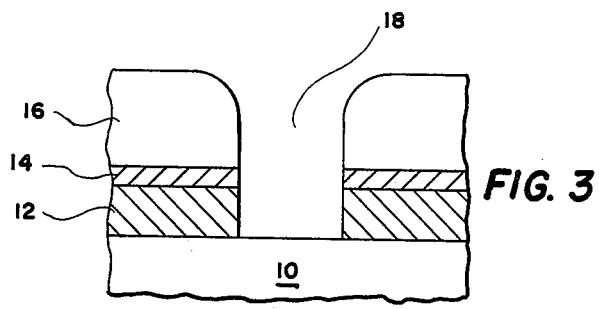

The resulting structure is shown in FIG. 3.

As will be described more particularly in the examples below, the line width definition of the resulting pattern is excellent, as is the uniformity of the pattern. That the titanium nitride and the underlying reflective layer can be etched sequentially in the same reactor and with the same etchant gases, is a great advantage of the present process.

The remaining titanium nitride film and photoresist can also be removed in a single step. Both titanium nitride and photoresist can be cleanly and rapidly removed in Caro's acid for example (a mixture of $H_2O_2$ and $H_2SO_4$). Some illustrative etch rates for the materials employed herein are given in Table III below:

TABLE III

| Material Etched | Etchant | Etch Rate, Angstroms/Minute |
|---|---|---|
| (1) Aluminum (1% Silicon) | 45:1 $H_2O$:HF | 80 |
| (2) TiON | 45:1 $H_2O$:HF | 900 |
| (3) TiON | Caro's Acid | 18,000 |
| (4) TiON | J-100 Developer | 0 |

The invention will be further illustrated by the examples given below but the invention is not meant to be limited to the details described therein.

EXAMPLE 1A

PATTERN EXPOSURE AND DEVELOPMENT

A photoresist, AZ1350J-SF, commercially available from the American Hoechst Corp., was coated to a thickness of 2 microns onto substrates having islands 0.5 micron high.

The control substrate had a 1.0 micron thick layer of aluminum on it. The aluminum was 84% reflective at 436 nanometers.

Sample 1A had a 1000 Angstrom thick layer of stoichiometric titanium nitride over a 1.0 micron thick layer of aluminum. The titanium nitride was 20% reflective at 436 nanometers.

Sample 1B had a layer of non-stoichiometric titanium nitride over a 1.0 micron thick layer of aluminum. The titanium nitride was 25% reflective at 436 nanometers.

A pattern mask of 1.25 micron equal lines and spaces was exposed with a g-line stepper over the 0.5 micron step, the exposure dose being adjusted depending on the reflectivity of the substrate to give equal lines and spaces.

The substrates were developed identically using AZ400K developer diluted 1:1 with water.

FIGS. 4–6 are SEMs of the resultant patterns. Line width control may be measured as the difference in width between the widest and narrowest portion of the developed line.

The line width variation for the control was 0.8 micron; that of Sample 1A was 0.21 micron; that of Sample 1B was 0.23 micron. Thus the use of the titanium nitride absorber layer greatly improved the line width control.

EXAMPLE 1B

PATTERN GENERATION IN THE SUBSTRATE

Using the Sample 1A wafer, the developed substrate was placed in a conventional aluminum plasma etcher. The etch conditions were: 80 cc/min. of $BCl_3$ and 10 cc/min. of chlorine at a pressure of 35–40 millitorr and power set at −240 volts. Under these conditions the aluminum etch rate is about 858 Angstroms/min. and the titanium nitride is about 200 Angstroms/min.

The plasma etched both the titanium nitride and the aluminum sequentially and anisotropically, to give a 1.25 micron pattern in the aluminum with straight sidewalls.

EXAMPLE 2

A 300 Angstrom thick layer of titanium nitride containing a small amount of oxygen was prepared by reactive sputtering of titanium at room temperature in a mixture of nitrogen and air onto silicon substrates having 0.4 micron high islands and a layer 5000 Angstroms thick of tantalum silicide thereon.

A layer of AZ1350J-SF photoresist containing 34 grams of 1-(2-pyridylazo)-2-naphthol (PAN) dye per gallon of resist was spun onto the substrates and baked to give a resist layer 2.2 microns thick.

The controls omitted the titanium oxynitride layer.

Control A employed a resist layer without the dye.

Control B employed a resist containing the PAN dye.

The resist was patterned by exposure using a mask of 1.25 micron lines with two gate arrays; one array having less than 100 gates and the other over 1000 gates.

Control A displayed necking of up to 0.3 micron over the tantalum silicide step. Further, the gates in the larger gate array showed varying degrees of overexposure across the array.

Control B had necking of 0.1 micron over the tantalum silicide step.

The substrates were plasma etched in a Drytech 2UAD single wafer reactor for 100 seconds using chloroform plasma. The remaining TiON and/or resist layers were stripped using Caro's acid.

FIG. 7 is an SEM of the resultant tantalum silicide pattern of the example. It is apparent that there is no "necking" or line width narrowing over the steps. This was so for both the small and large gate arrays.

Thus the TiON absorptive layer improved the line width control of the pattern etched in tantalum silicide.

EXAMPLE 3

A substrate having islands 0.4 micron high and having a layer of aluminum containing 1% of silicon about 7500 Angstroms thick thereon and a reflectivity of about 90% was coated with a layer of titanium oxynitride about 2300 Angstroms thick. The titanium oxynitride was applied by reactive sputtering in a mixture of 2.6 millitorr argon, 8.0 millitorr of nitrogen and 0.1 millitorr of oxygen at room temperature. The power to the cathode was set at 2.75 kilowatts.

The substrate was coated with a dyed photoresist as in Example 2 and patterned by exposure through a mask of 1.00 micron equal lines and spaces and developed as in Example 2.

The aluminum was plasma etched as in Example 1.

FIG. 8 is an SEM of the resultant pattern of lines 0.75 micron and spaces 1.3 micron wide showing no necking of the lines as they pass over the islands. The aluminum sidewalls are at a 90° angle.

In comparison a control using the dyed resist over the aluminum but without the titanium oxynitride absorber layer could not be resolved. The photoresist was bridged between the lines in some places and the lines were eroded away in other places, depending on the occurrence of the standing waves. FIG. 9 is an SEM of the resultant pattern.

We claim:

1. In a process for patterning a reflective layer on a substrate which comprises depositing said reflective layer, coating said layer with photoresist, exposing a portion of said photoresist, developing said photoresist to provide openings in the photoresist layer to the reflective layer and etching away the reflective layer in said opening, the improvement which comprises providing a titanium nitride layer intermediate the photoresist layer and the reflective layer, and after the etching step removing the remaining photoresist and the titanium nitride.

2. A process according to claim 1 wherein the reflective layer is a layer of aluminum.

3. A process according to claim 1 wherein the reflective layer is a layer of tantalum silicide.

4. A process according to claim 1 wherein the titanium nitride is stoichiometric titanium nitride.

5. A process according to claim 1 wherein the titanium nitride is a non-stoichiometric titanium nitride.

6. A process according to claim 1 wherein the titanium nitride contains oxygen.

7. A process according to claim 1 wherein the substrate has topographical features.

8. A process according to claim 1 wherein the photoresist contains an absorbent dye, absorbent at said frequency.

9. A process according to claim 1 wherein the reflective layer is aluminum and the etchant is a plasma containing chlorine.

10. A process according to claim 4 wherein the reflective layer is tantalum silicide and the etchant is a plasma containing chlorine.

11. A process according to claim 3 wherein the etchant is a plasma containing chloroform.

12. A process according to claim 1 wherein the reflective layer is tantalum silicide, the titanium nitride is $TiO_xN_y$, wherein x is about 0.8–1.3, y is about 0.8–1.2 and the etchant is a plasma containing chlorine.

13. A process according to claim 1 in which the remaining photoresist and the titanium nitride are removed at the same time with the same material.

* * * * *